United States Patent [19]
Lake

[11] Patent Number: 5,987,739
[45] Date of Patent: *Nov. 23, 1999

[54] METHOD OF MAKING A POLYMER BASED CIRCUIT

[75] Inventor: Rickie Charles Lake, Eagle, Id.

[73] Assignee: Micron Communications, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/596,472

[22] Filed: Feb. 5, 1996

[51] Int. Cl.$^6$ ................ H05K 3/30; B05D 3/06
[52] U.S. Cl. ................ 29/841; 29/832; 29/846; 427/558
[58] Field of Search ................ 29/832, 840, 841, 29/846; 427/553, 554, 555, 412.5, 558

[56] References Cited

U.S. PATENT DOCUMENTS

| | | | |
|---|---|---|---|
| 3,227,605 | 1/1966 | Wolinski | 161/247 |
| 4,261,800 | 4/1981 | Beckenbaugh et al. | 427/553 |
| 4,311,749 | 1/1982 | Hiraiwa et al. | 428/209 |
| 4,317,011 | 2/1982 | Mazurk | 200/5 A |
| 4,317,013 | 2/1982 | Larson | 200/5 A |
| 4,843,036 | 6/1989 | Schmidt et al. | 29/841 |
| 4,868,006 | 9/1989 | Yorkgitis et al. | 427/53.1 |
| 5,264,061 | 11/1993 | Juskey et al. | 427/553 |
| 5,296,273 | 3/1994 | Abe et al. | 427/553 |
| 5,302,402 | 4/1994 | Dudenhoeffer et al. | 426/129 |
| 5,434,214 | 7/1995 | Wolosen et al. | 524/720 |
| 5,448,110 | 9/1995 | Tuttle et al. | 257/723 |
| 5,461,202 | 10/1995 | Sera et al. | 174/254 |

FOREIGN PATENT DOCUMENTS

| | | | |
|---|---|---|---|
| 0 357 802 | 3/1990 | European Pat. Off. | H01L 23/29 |
| 5 809 8340 | 11/1983 | Japan | C08J 7/10 |
| 5 919 7433 | 9/1984 | Japan | C08J 7/04 |
| 59-197433 | 11/1984 | Japan | |
| 0 602 1620 | 1/1994 | Japan | H05K 3/24 |

OTHER PUBLICATIONS

"EPIC R1055–01/H5039 Casting System" *Resins product bulletin*, (3p).
"1993 Industrial Films Product Guide" *Melinex Polyester Films*.
"Melinex 454, Technical Data," *Melinex Polyester Films, ICI Films*, Copyright 1994.
"Melinex ST 505 Heat–Stabilized Polyester Film, Technical Data," *Melinex Polyester Films, ICI Films*.
"Melinex ST 507 Heat–Stabilized Polyester Film, Technical Data," *Melinex Polyester Films*, ICI Films.
McIntyre, N. Stewart and Walzak, Mary Jane," New UV/Ozone Treatment Improves Adhesiveness of Polymer Surface," Modern Plastics, Mar. 1995, pp. 79–81.

*Primary Examiner*—P. W. Echols
*Attorney, Agent, or Firm*—Mueting, Raasch & Gebhardt, P.A.

[57] ABSTRACT

A polymer based circuit production method provides a polymer based circuit by exposing a surface of a polymer substrate to ultraviolet radiation resulting in an adhesion promoted polymer substrate surface. A circuit is fabricated on the polymer substrate surface and a coating material is applied to at least a portion of the adhesion promoted polymer substrate surface. A portion of the circuit fabricated on the polymer substrate surface may be encapsulated. The polymer based circuit resulting from the method includes a polymer substrate having an ultraviolet radiation treated surface, a circuit formed on the polymer substrate surface, and a coating material encapsulating at least a portion of the at least one circuit between the polymer substrate and the coating material.

42 Claims, 5 Drawing Sheets

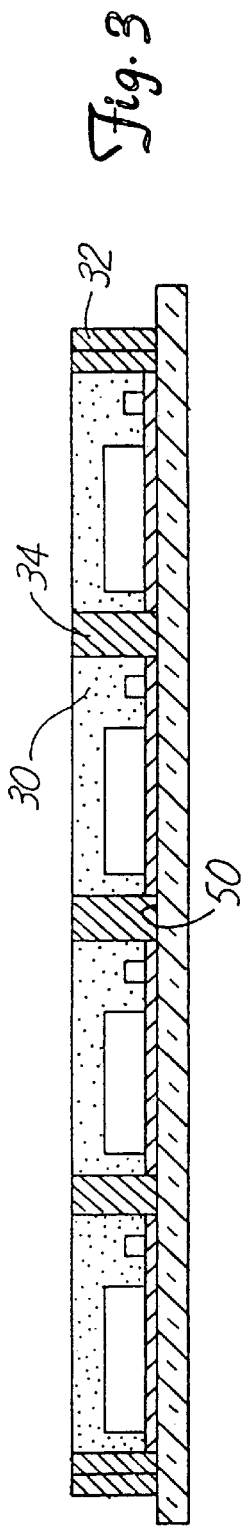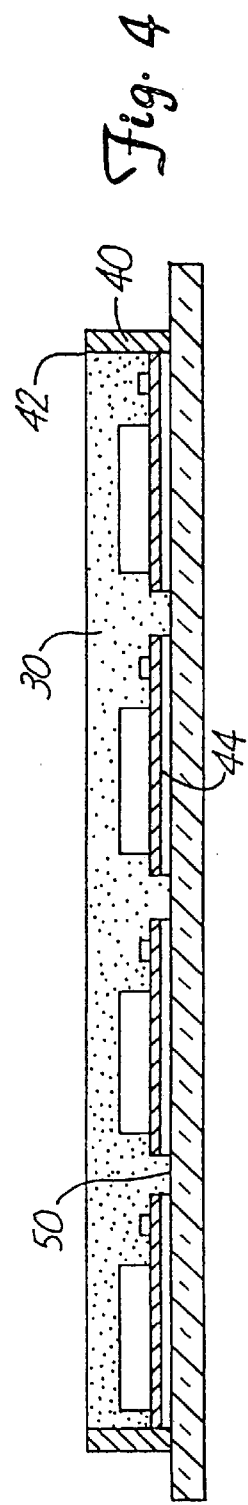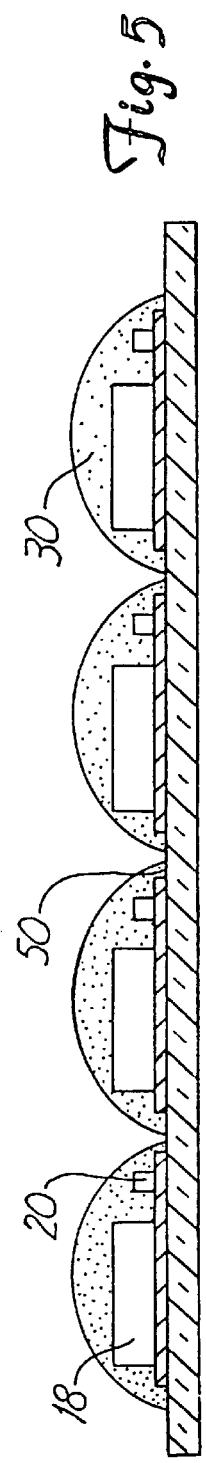

METHOD OF MAKING A POLYMER BASED CIRCUIT

FIELD OF THE INVENTION

The present invention relates generally to polymer based circuits and the methods of producing such circuits. More particularly, the present invention pertains to the use of ultraviolet radiation in producing such polymer based circuits.

BACKGROUND OF THE INVENTION

Packaged and unpackaged semiconductor dice and other associated microcircuitry are widely used in the production of a variety of electronic devices. As the variety of uses continues to grow, a need has arisen in the industry for improvements in the technology relating to forming and packaging such electronic devices. In many cases, microcircuitry is mounted to rigid substrates such as printed circuit boards. Such substrates provide structural integrity to support the components mounted thereon and provide protection to the components from damage.

However, in many applications, electronic devices are required to have some flexibility, required to have continuous or periodic movement of the circuit as part of the end product function, required to accommodate odd configurations, or required to avoid breaking of the substrate upon impact with other objects. In such applications, microcircuitry in addition to electronic traces, are applied and/or mounted to flexible or polymer substrates. For example, and in no manner limiting to the present invention, different polymer based circuits are described in U.S. Pat. No. 5,448,110 entitled "Enclosed Transceiver" and assigned to Micron Communications, Inc.; U.S. Pat. Ser. No. 5,612,513 entitled "Article and Method of Manufacturing an Enclosed Electrical Circuit Using an Encapsulant" and assigned to Micron Communications, Inc.; U.S. Pat. No. 5,461,202 entitled "Flexible Wiring Board and Its Fabrication Method"; and U.S. Pat. No. 4,317,011 entitled "Membrane Touch Switch."

In many polymer based circuits, such as some of those described above, an encapsulant is utilized over the entire circuit as opposed to just the individual components. In other polymer based circuits, only individual components mounted on polymer or flexible substrates are encapsulated to allow for an electronic device that is relatively more flexible than when the entire circuit is encapsulated. Further, in other polymer based circuits, encapsulant or other coating materials may be used as spacers to configure devices such as membrane touch switches. However, in all of these different polymer based circuits, the adherence of the encapsulant or coating material to the polymer film or flexible substrate is of substantial importance to the method of producing such circuits and the resulting electronic devices.

Several methods of promoting adhesion of coatings and adhesives, including encapsulant, to polymer films are currently in use. Primarily such methods include mechanical abrasion, flame, corona, and chemical primering by either direct mechanical or chemical attack of a surface of the polymer film or by coating the surface of the polymer film with another adhesion promoting coating material. For example, an adhesion promoting resin such as Chemlok Primer AP-133 supplied by Lord Corporation, Erie, Pennsylvania, is currently utilized. Other chemically print treated polymer films, such as certain Melinex® polyester films, are available from Imperial Chemical Industries or ICI Americas Inc., having a place of business in Wilmington, Del.

However, such adhesion promoting methods, like flame, corona, mechanical abrasion, and chemical primering, require substantial capital investment and, in many cases, is cost prohibitive. Further, some print treated polyester films, like that available from ICI Americas Inc., are ineffective as adhesion promoting surfaces for adhesion of certain encapsulants. Therefore, there is a need in the art for making polymer based circuits with improved adhesion promoting methods. Such methods would improve upon the structural integrity and the reliability of polymer based circuits.

SUMMARY OF THE INVENTION

A polymer based circuit production method in accordance with the present invention provides a method of improving the adhesion of coating materials to the polymer substrates producing an improved electronic device. The method includes exposing a surface of a polymer substrate to ultraviolet radiation resulting in an adhesion promoted polymer substrate surface. At least one circuit is formed on the polymer substrate surface and a coating material is applied to at least a portion of the adhesion promoted polymer substrate surface.

In one embodiment of the method, at least a portion of the circuit formed on the polymer substrate surface is encapsulated.

In further embodiments of the method, the polymer substrate may be a polyester film, the coating material may be an epoxy, and/or the epoxy when cured may have a hardness greater than about 30, Shore D.

In another embodiment of the method, the circuit formation includes forming a conductive trace on the polymer substrate surface. The circuit components are mounted on the polymer substrate surface in electrical communication with the conductive trace to form the electrical circuit. Further, the application of the coating material includes forming a barrier on the polymer substrate surface to define at least one cavity surrounding at least a portion of the at least one circuit and includes depositing the coating material in the at least one cavity such that the components in the at least one cavity are encapsulated between the polymer substrate and the coating material.

In yet other embodiments of the method, the application of the coating material may include applying the coating material in a predefined pattern on the polymer substrate surface or may include globbing the coating material over individual components of the circuit.

The circuit in accordance with the present invention includes a polymer substrate having an ultraviolet radiation treated surface. At least one circuit is formed on the polymer substrate surface and a coating material encapsulates at least a portion of the circuit between the polymer substrate and the coating material.

In other embodiments of the circuit, the polymer substrate may be a polyester film, the coating material may be an epoxy, and/or the epoxy may have a hardness greater than about 30, Shore D.

In a further embodiment of the circuit, the circuit includes a polymer substrate having an ultraviolet radiation treated surface. At least one circuit is formed on the polymer substrate and a coating material is cured in a predefined pattern on at least a portion of the polymer substrate.

BRIEF DESCRIPTION OF THE DRAWINGS

FIG. 3 is a cross-section view of an alternate embodiment of the array of FIG. 1;

FIG. 4 is a cross-section view of another alternate embodiment of the array of FIG. 1;

FIG. 5 is a cross-section view of another alternate embodiment of the array of FIG. 1;

DESCRIPTION OF THE PREFERRED EMBODIMENTS

Figure 1:
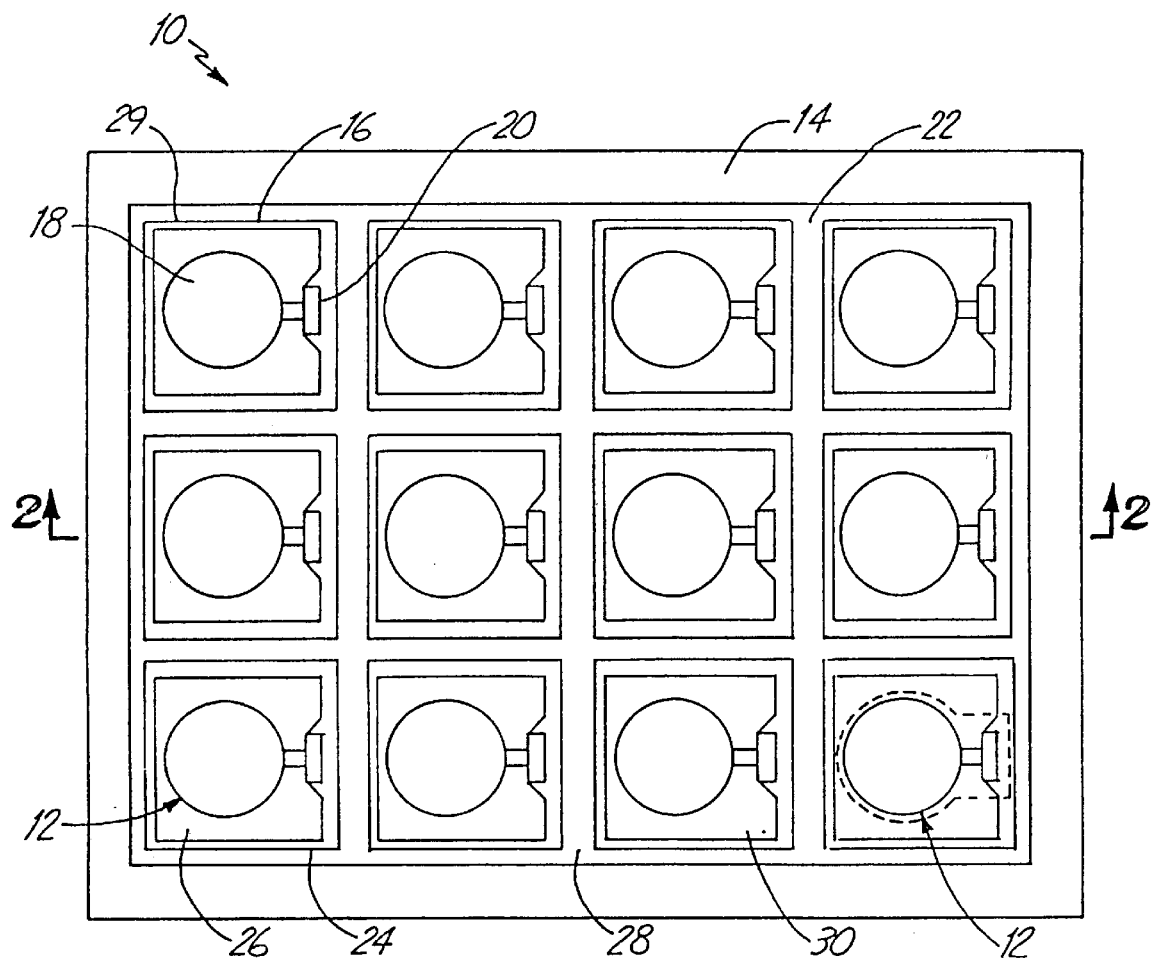
FIG. 1 is a top view of an array of separable polymer based circuits produced in accordance with the present invention.
Figure 2:
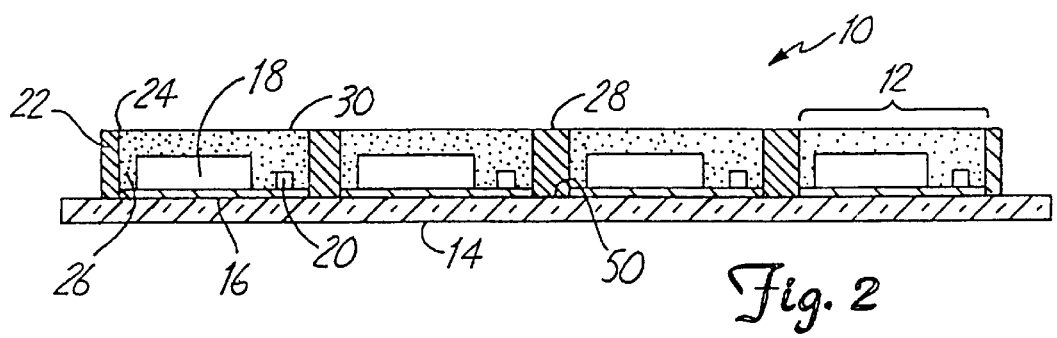
FIG. 2 is a cross-section view along line 2—2 of FIG. 1.

With reference to FIGS. 1 and 2, a polymer based circuit array 10 in accordance with the present invention shall be described. This circuit array is, in part, described in detail in U.S. Pat. No. 5,612,513 entitled "Article and Method of Manufacturing an Enclosed Electrical Circuit Using an Encapsulant," assigned to Micron Communications, Inc. and hereby incorporated by reference thereto. The circuit array 10 includes a plurality of separable or individual polymer based circuits 12. The circuit array is shown following encapsulation of various components of the individual circuits 12 but prior to separation. The circuit array 10 includes twelve individual circuits; however, any particular array may have fewer or greater number of circuits and may be of any particular configuration, shape or size.

The polymer based circuit array 10 includes a polymer substrate 14. The polymer based circuit array can be made with a number of different polymer substrates which are known in the art. Such polymer substrates may include polyimides like Kapton™ available from DuPont, polyester trephthalate or Mylar™ available from DuPont; polytetrafluoroethylene (PTFE) or Teflon™ available from DuPont; polyethylene terephthalates (PET); polycarbonates like Lexan™ available from General Electric; polyvinylchloride (PVC); polyetherimide such as Ultem™ film available from General Electric, Pittsfield, Mass.; and any other polyester film or polymer film used by those skilled in the art for making polymer based or flexible circuits. Such substrates vary in properties of flexibility and the degree of flexibility is not limiting to the scope of the present invention. Some additional specific polyester films which can be utilized as the polymer substrate include Melinex® polyester films available from Imperial Chemical Industries or ICI Americas Inc., having a place of business in Wilmington, Del. Furthermore, the substrate can be very thin to further contribute to its flexibility. For illustrative purposes only, the substrate utilized can be of a thickness of from 0.0009 inches (0.9 mils) to 0.010 inches (10 mils).

Each individual polymer based circuit 12 includes a conductive trace formed on the substrate 14. The conductive trace 16 can be formed as a single trace or as a plurality of conductive traces. The particular pattern or configuration of the conductive trace 16 is dependent upon the type of circuit and the types and numbers of components to be mounted on the polymer substrate 14. A portion of the trace 16 can form an antenna 29. The conductive traces 16 can be made of a number of materials and compositions, all of which are well known to one skilled in the art. For example, a conductive ink can be applied to the substrate 14 using conventional screen printing techniques. Alternately, the conductive traces 16 can be a patterned metal layer formed on substrate 14 using well known deposition, photo patterning and etching processes.

Attached to, mounted on, or somehow positioned on the polymer substrate 14 are one or more electrical components. As shown in FIG. 1 and 2, a battery 18 and a semiconductor die 20 are mounted to the substrate 14. Throughout the embodiments of FIGS. 1–6, the components mounted include a battery and semiconductor die. By including an antenna, battery and semiconductor die as the circuit, each circuit can communicate with the outside world using RF signals and as such, for example, information received by the circuit can be stored in memory of the die. However, any other circuitry and circuit components (for example, resistors, diodes, antennas etc.) can also be attached, mounted or positioned on the polymer substrate 14 as required or as dictated by the application of the electronic device. Furthermore, these elements can be separate components attached to the polymer substrate 14 or can be integral components mounted, attached, formed, or deposited on the substrate 14 by such processes well known to those in the art such as screen printing or other deposition processes.

The components mounted on the substrate, such as battery 18 and semiconductor die 20, are mounted using methods and materials such as conductive adhesive which establishes an electrical connection with the conductive trace 16. Further, for example, the bond pads of the die 20 are placed in electrical contact with the applicable portions of conductive trace 16. Constructed in this manner, the conductive trace 16, the battery 18 and the die 20 form the individual electrical circuit. However, as mentioned above, this circuit is only one of many circuits which can be formed on a polymer substrate for a particular application and many other circuits as part of a polymer based circuit may be substituted without departing from the scope of the invention as defined in the accompanying claims. For example, polymer based circuits for Automated Teller Machines (ATMs), for membrane touch switches, for calculators, for keyboards, for transceivers including the transceivers described herein, and any other circuit where a polymer based circuit is required for a particular application can be substituted for the illustrative circuits described herein.

After the circuits are formed on the substrate 14, a barrier 22, which could be referred to as a compartmental dam, is formed or positioned for encapsulating the circuits formed on the polymer substrate 14. As shown in FIGS. 1 and 2, the barrier 22 forms compartments about each circuit separately. The barrier 22 includes openings 24 that are of substantially square configuration that define cavities 26 for placement of encapsulant 30. The barrier may be formed of a thin walled rigid material such as stainless steel, polycarbonate, or hard plastic. Further, the barrier could be a bead of an epoxy, silicone, or other curable material. The openings may be of any number of shapes such as for example, polygonal, round, rectangular, or oval. The barrier 22 is placed in contact with the substrate 14 to prevent coating material or encapsulant from leaking out. The barrier 22 can be maintained in contact with the substrate under its own weight or by using a clamp or additional weight. The top edge of the barrier 22 can also be contoured to conform to the surface topography of the circuit components.

As shown in FIG. 3, the barrier is formed with openings 34 which follow the configuration of the circuit formed on the substrate 14 such as illustrated by the dashed line 34 of FIG. 1. In such a manner only the components of the circuit are encapsulated and if the barrier is removed the polymer based circuit will have greater flexibility than if the encapsulant were placed over the entire polymer substrate 14.

Further, as shown in FIG. 4, the barrier 40 is formed with a single opening 42 which is of rectangular configuration for forming a cavity containing all of the individual circuits. In such a manner the barrier is simplified. Encapsulant is then placed over the entire polymer substrate 14 and individual circuits 12. FIG. 4 also includes an ink layer 44 applied to the substrate. The ink layer permits formation of numbers, letters, logos, graphic designs and the like on the inside surface of substrate 14. The ink layer 44 can include multiple colors of ink and can be applied using known screen printing methods or any other methods of depositing ink as are known to those skilled in the art. The ink layer can be viewed through the opaque substrate 14.

In each of the polymer based circuit arrays shown in FIGS. 1–4, the cavities are filled with coating material or encapsulant 30 to encapsulate the array as defined by the barriers 22, 32, 40. The encapsulant 30 may be one of many different materials, any of which can be cured or dried from a viscous or liquid state to a hardened state. For example, the encapsulant 30 may include a two part epoxy and further may be formulated to be opaque. In FIG. 1, the encapsulant is shown as being transparent to allow for viewing of the components. In most cases, the particular coating material or encapsulant utilized is dependent on the desired curing times, curing method, resulting hardness and resulting flexibility of the encapsulant 30. As is known to those skilled in the art, the particular coating material utilized may be varied to achieve particular characteristics desired. In addition, curing can be effected in stages such that a partial cure can be performed to allow removal of the barrier 22, 32, 40 followed by a total cure without the barrier 22, 32, 40. Furthermore, the cavities formed by the barrier do not need to be completely filled. In some instances, it may even be beneficial for the encapsulant not to cover all the components completely and may be placed in the cavities in different thickness. For example, the thickness covering only traces may be different than the thickness of the encapsulant covering components.

Once the encapsulant 30 is cured or hardened to its final state, the circuit array 10 can be separated into individual enclosed or partially encapsulated circuits 12. The separation process can be performed by sawing, routering or shearing or any other method known to one skilled in the art without departing from the scope of the claimed invention as described in the accompanying claims. Portions of the barriers 22, 32, or 40 may be retained or may be removed. In order to facilitate removal of the barrier, it is possible to apply a releasing agent to the barrier prior to mounting the barrier on the substrate 14 and prior to depositing the encapsulant or coating material 30. The releasing agent may be any known anti-stick material, such as for example, a mold releasing agent or a permanently bonded material such as Teflon.

FIG. 5 is illustrative of the circuit array 10 of FIG. 1 without a barrier being utilized. The cross-section view of FIG. 5 shows the components 18 and 20 under the globbed coating material or encapsulant 30. In this embodiment, it is illustrated that a barrier is not necessary. Depending on the viscosity of the coating material, the material may be deposited by globbing or placement over the components either individually or in combination.

Figure 6A:
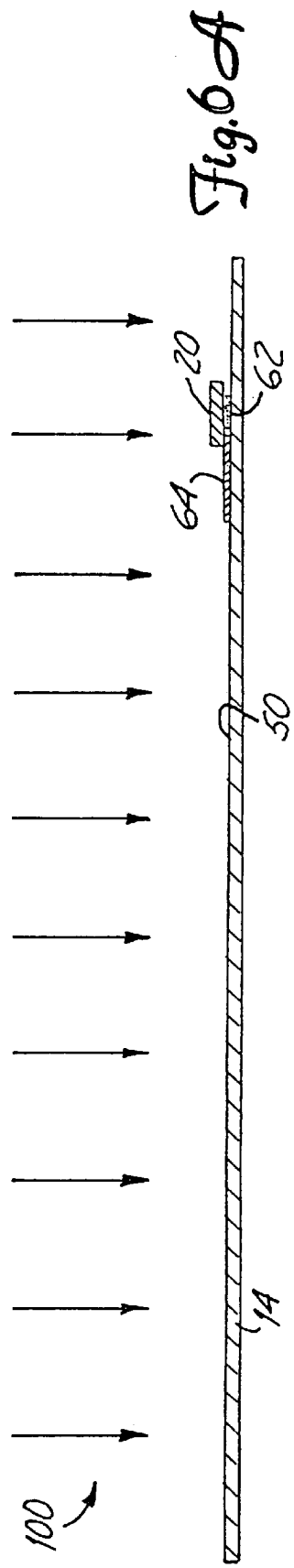
FIGS. 6A–6D are cross-section views showing processing steps used in constructing an enclosed transceiver in accordance with the present invention.
Figure 6B:
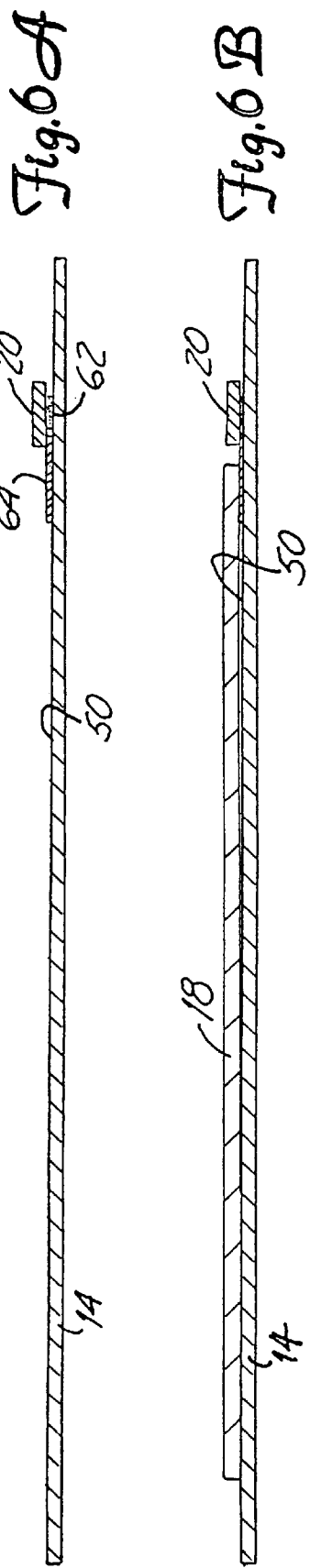
Figure 6C:
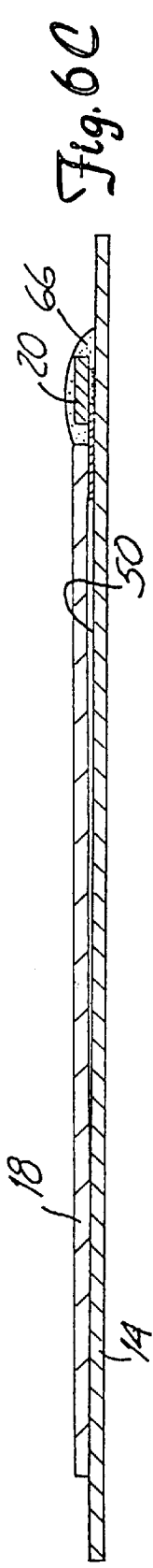
Figure 6D:
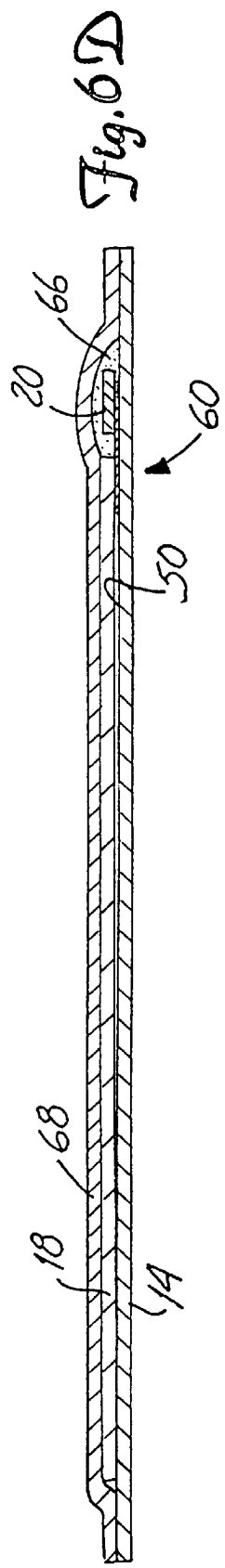

FIGS. 6A–6D, show a cross-section view of steps for producing a polymer based circuit described in U.S. Pat. No. 5,448,110 entitled "Enclosed Transceiver," assigned to Micron Communications, Inc. and further in accordance with the present invention. U.S. Pat. No. 5,448,110 is hereby incorporated by reference thereto. This enclosed transceiver 60 is summarily described as the components, battery 18 and die 20, are the same components as described in the previous embodiments. As shown in FIG. 6A, the integrated circuit die 20 is bonded to a polymer substrate 14 by an adhesive material 62. Strip 64 is a conductive strip on the upper surface of the polymer substrate 14. As shown in FIG. 6B, the battery 18 is aligned in place and connected to the upper surface of the conductive strip 64 by means of a conductive adhesive (not shown). A stiffener material 66 is applied as shown in FIG. 6C over the upper and side surfaces of integrated circuit die 20. The coating material 66 is like that of the coating material 30 described in the other embodiments and provides a desired degree of stiffness to the packaging. The stiffener material would preferably be an insulating material, such as "glob-top" epoxy, to provide a desired degree of stiffness to the package as completed. Then, as shown in FIG. 6D, a cover layer of flexible material like that of the substrate 14 is positioned over the components shown in FIG. 6C. The package is then sealed such as by curing or heating to form the electrical device.

A cover could be added to any of the previously described embodiments. The flexible cover could be attached to the circuits of the other embodiments while the encapsulant is still in its liquid state or could be attached to the encapsulant with an adhesive or other suitable bonding technique after the encapsulant is hardened. The cover could be treated with the UV radiation technique as described further below to promote adhesion just as substrate 14 is exposed.

Figure 7:
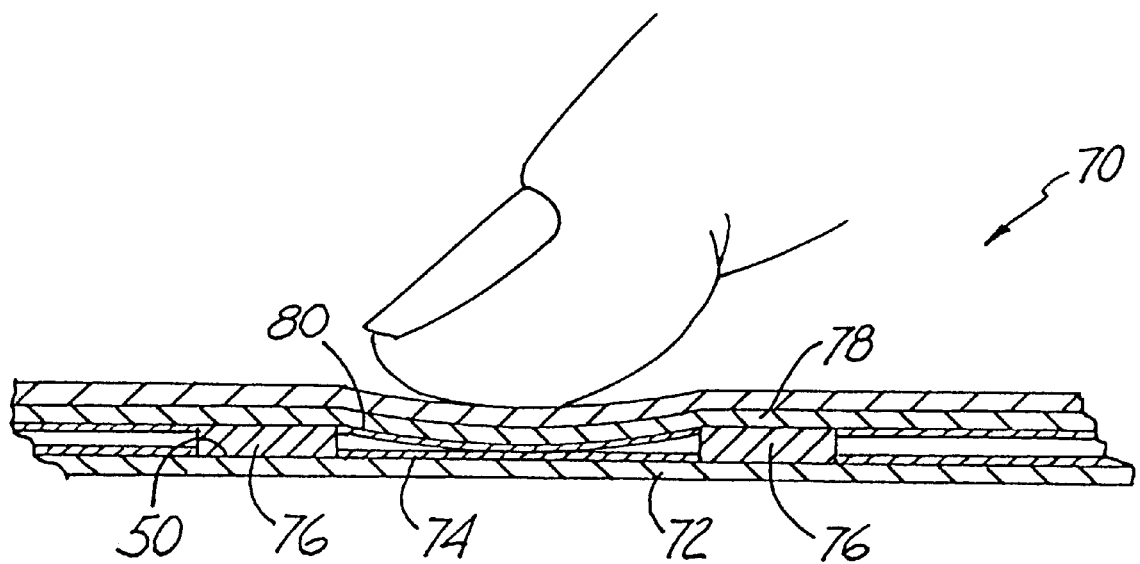
FIG. 7 is a cross-section view of a part of a membrane touch switch constructed in accordance with the present invention.

FIG. 7 shows a membrane touch switch 70. The general construction of the membrane switch 70 includes a polymer substrate 72. Conductor 74 is applied on the polymer substrate 72. Another flexible polymer film 78 also has a conductive layer 80 applied thereto. The selective portions of the conductive layers are aligned and spaced apart by spacers 76 such that when a user presses on polymer film 78 contact of the conductive films 74 and 80 completes an electric circuit. Spacers 76 must adhere to the polymer film or substrate 72 such that twisting and moving thereof is prohibited.

As described above, any number of various polymer based circuits can be fabricated. In each polymer based circuit, adhesion of coatings, inks, encapsulants and adhesives to polymer substrates is of significant importance. In accordance with the present invention, each embodiment shows an improved polymer based circuit having improved adhesion characteristics of the coating materials, including inks, to the substrates 14 of the various polymer based circuits. Each of the improved polymer based circuits, generally includes a polymer substrate that has been exposed to ultraviolet (UV) radiation resulting in a adhesion promoted surface 50. A circuit, which may include only a conductor, is fabricated on the polymer substrate. Finally, a coating material, is applied to at least a part of the adhesion promoted surface 50 of the polymer substrate. Such coating material may be used for providing spacers of a touch membrane switch, encapsulating components of the circuit, encapsulating the entire electrical device or circuit, or as is otherwise described herein and which would be apparent to one skilled in the art.

For example, in the embodiment shown in FIGS. 1 and 2, an encapsulant 30 is deposited in the cavity 26 within the barrier 22. The encapsulant 30 is in contact with the adhesion promoted polymer substrate surface 50. In the embodiment of FIG. 3, encapsulant 30 is placed in the cavity formed by barrier 32 and is in contact with the adhesion promoted polymer substrate surface 50. In the embodiment of FIG. 4, the encapsulant 30 is placed in the cavity formed by barrier 40 and is once again in contact with the adhesion promoted polymer substrate surface 50. The globbed encapsulant 30 as shown in the embodiment of FIG. 5 is also in contact with the adhesion promoted polymer substrate surface 50.

FIG. 6A shows the step forming the adhesion promoted surface 50 on the substrate 14 by exposing the substrate to the UV radiation 100. In this embodiment, the stiffener material 66 is in contact with the adhesion promoted polymer substrate surface 50. Further, as shown in FIG. 7, the spacer material is also in contact with the adhesion promoted polymer substrate surface 50.

The process of producing a polymer based circuit in accordance with the present invention, utilizing the step of exposing the polymer substrate at some point in time to UV radiation, shall be described with reference to FIG. 8–10. Generally, it is shown that exposing the polymer substrate to UV radiation increased adhesion levels of coating materials to the polymer substrate. It is found that material coatings applied to nonexposed, control samples had poor adhesion to the polymer substrate as compared to the adhesion levels, which were significantly improved, for polymer substrates that were exposed to UV radiation. Further, adhesion levels of the polymer substrates improved measurably with increasing number of passes through UV radiation units or equipment. Such exposure to UV radiation is also advantageous with polymer substrates that have been print treated for adhesion by another technique such as chemical primering.

Figure 8:
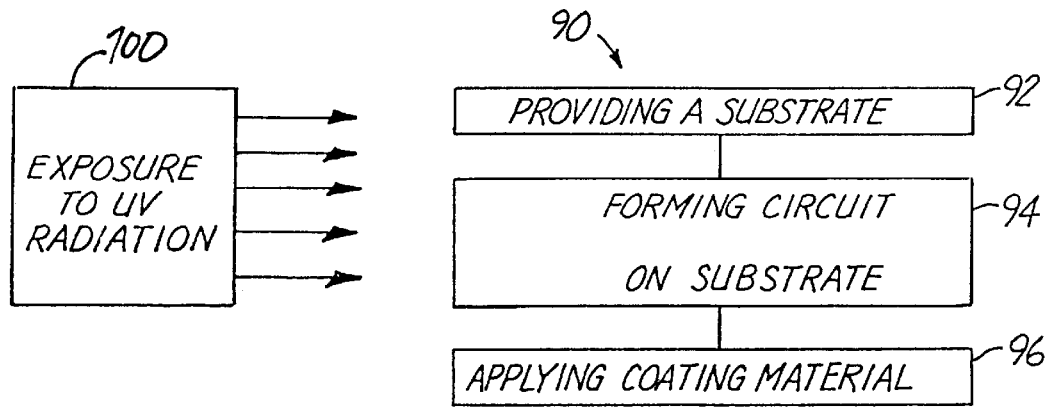
FIG. 8 is a flow diagram showing the polymer based circuit production steps in accordance with the present invention.
Figure 9:
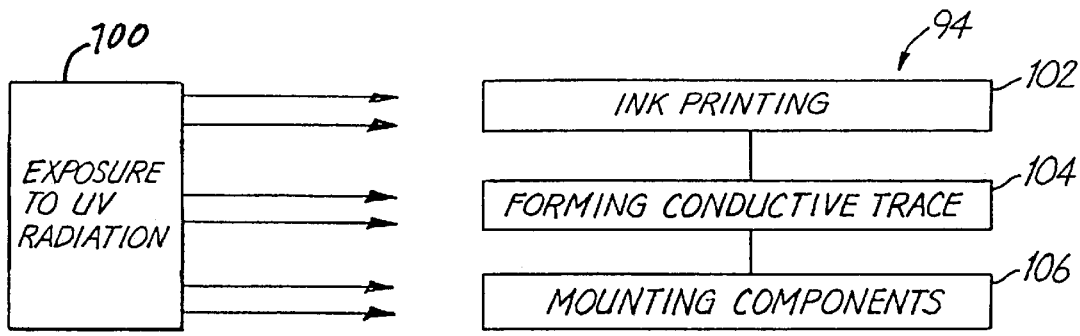
FIG. 9 is a flow diagram showing steps of one embodiment of the circuit forming step of FIG. 8.

FIG. 8 shows a flowchart 90 generally describing the steps of producing a polymer based circuit in accordance with the present invention. Generally, the polymer based circuit production method 90 is applicable to all polymer based circuits and is not intended to be limited to only those illustrative devices previously described. Such circuits have been provided as illustrations of the various types of polymer based circuits, such as enclosed transceivers and membrane touch switches, which benefit from the improved adhesion promoting process shown in FIG. 8.

Generally, all of the polymer based circuits are produced according to the three process steps shown in FIG. 8. First, a polymer substrate or flexible substrate is provided as represented in step 92. As previously described with reference to the substrate 14 in the various embodiments, the substrate provided can be of various polymers even if the polymers are substantially rigid. Any polymer used in the art for polymer or flexible based circuits may be used. For example, as previously described, the polyester films available from ICI Americas, Inc. may be utilized.

Second, as shown by forming step 94, a circuit is formed on the polymer substrate. Such a circuit may take the form of a conductive trace in the case of a membrane touch switch. In other cases, such as the embodiment described with reference to FIG. 1–6, and further detailed in the flow chart of FIG. 9, an ink layer may be printed on a polymer substrate that is transparent to make markings on the enclosed circuit, including graphics, lettering, numbering, logos, etc. The ink layer may be applied to the surface of the substrate by screen printing or other deposition methods. Multiple colors may require multiple layers of ink and for the markings or graphics to be correctly visible through the substrate the images are applied in reverse orientation as would be readily apparent to one skilled in the art.

As described by step 104, a conductive trace can be formed on the substrate by using a method such as, for example, screen printing or etching. Then various components can be mounted on the substrate by an adhesive, preferably a conductive adhesive. Conductive adhesives are well known in the art and any such adhesive may be utilized such as an isotropic silver filled conductive epoxy, such as AbleBond 8380 available from Ablestik Electronic Materials & Adhesives, Rancho Dominguez, Calif., or a z-axis anisotropic epoxy, such as LZSP 8410 available from Al Technology Inc., Lawrenceville, N.J. In one embodiment, the adhesive layer is about 2 mil thick. The electrical components of the circuit mounted are held in place by the adhesive. Specifically for the embodiments described in FIGS. 1–6, die 20 and battery 18 are mounted with electrical connection to the conductive trace 16. As previously described, the present invention is not limited to only the components of the illustrative embodiments as any number of circuits may be formed on the polymer substrate with any number of different electrical components.

Figure 10:
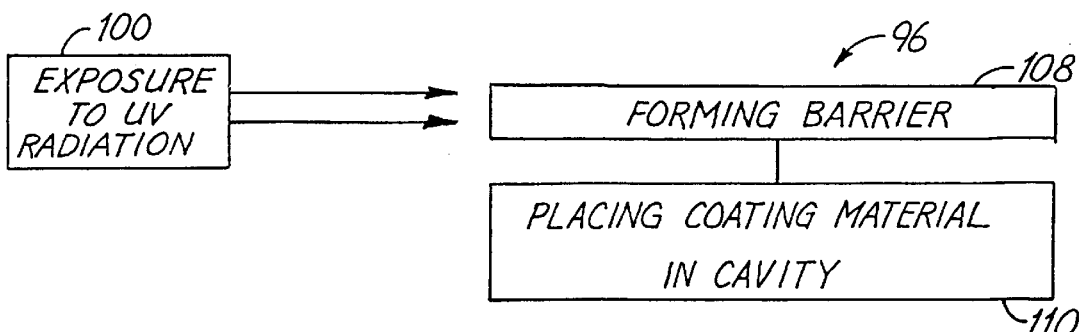
FIG. 10 is a flow diagram showing steps of one embodiment of the coating application step of FIG. 8.

During any one of the above mentioned steps, and further during the forming of a barrier as represented by the step 108 of FIG. 10, the polymer based circuit being produced may be exposed to UV radiation to provide an adhesion promoted surface on the polymer substrate. The exposure to UV radiation prior to the application of a coating material, is represented generally by step 100. Although the polymer based circuit being produced may be irradiated with UV radiation during any of the steps preceding application of a coating material, it is preferred that the substrate be irradiated prior to the forming of the circuit shown as step 94. Further, because the polymer based circuit being produced may be irradiated with UV radiation during any of the steps preceding application of a coating material, an adhesion promoted surface, such as the surface 50 in the described embodiments, may not cover the entire polymer substrate due to UV radiation being blocked during application. The exposure of the polymer substrate to UV radiation shall be described further below with regard to the examples.

In the last step, a coating material, such as an epoxy encapsulant, is applied to at least a portion of the adhesion promoted surface on the polymer substrate as represented by step 96 and further detailed, as least for the embodiments of FIGS. 1–4, in the flowchart of FIG. 10. The coating material utilized with the polymer based circuit and method of applying the coating material, for example, via a barrier or glob method, is highly dependent upon the device application for the polymer based circuit.

Some coating materials, such as epoxy encapsulants, generally have the characteristic that the harder the epoxy encapsulant, the lower the peel strength of the epoxy encapsulant from various materials, including polymer substrates. Therefore, the improved adhesion promotion process 90 is particularly advantageous when utilized with polymer based circuits requiring coating materials having a hardness of about 60 and over, according to the Shbre D scale. More particularly, the improved adhesion promotion process 90 is more advantageous for coating materials having a Shore D hardness value of about 80 and over. However, the improved adhesion promotion process 90 is also beneficial for use with coating materials having a Shore D hardness value as low as 30.

The application of the coating material may perform different functions for the polymer based circuits produced. For example, with respect to the touch membrane switch the coating material may provide the function of a spacer 66 as shown in FIG. 7. For the enclosed transceiver 60 of FIG. 6, the coating material functions as a stiffener material 66 for purposes of having a cover 68 applied thereover. In the embodiment of FIG. 5, the coating material or encapsulant 30 applied using a glob technique provides protection for the components of the circuit. Still further, the coating material or encapsulant 30 shown in FIGS. 1–4, provide protection of the circuit as well as forming a part of the overall exterior of the packaged device. Other application of coating materials, for example inks for marking, also provide a useful function and benefit from the improved adhesion process 90.

More particularly with respect to the embodiments of FIGS. 1–4, a barrier 22, 32, 40 is mounted on the substrate to provide different configurations of cavities to fill with encapsulant 30. As described previously, such barriers may be of any configuration for a particular application or circuit. The encapsulant 30 is placed in a viscous state in the cavities and the encapsulant is allowed to dry or is cured. The type of coating material utilized determines the necessary steps for hardening or drying and are well known in the art. As described previously, if a circuit array is the resulting polymer based circuit then it can be separated into individual circuits by a number of techniques. Further, a cover can be applied which has also undergone the UV radiation exposure prior to curing or drying to further improve the overall packaged device integrity.

Each of the above circuits or devices illustrates the various configurations of polymer based circuits which may benefit from the improved adhesion promoting process 90 described with reference to FIG. 8. In each of the above circuits, a coating material is applied to at least a portion of the adhesion promoted surface to provide some benefit to the polymer based circuit. In each of these cases, it is important for the coating material to have substantially improved adhesion characteristics with respect to the polymer substrate. It is not required that the coating material be applied over the entire polymer substrate for the polymer based circuit to benefit. Further, although the improved adhesion promoting process 90 is particularly advantageous when used with harder epoxies having a Shore D value of about 60 and greater, the improved adhesion promoting process is beneficial for other coating materials, in addition to screen printed materials, logo inks, and the like.

Further, although softer epoxy encapsulants, such as a flexible epoxy casting resin, Polychem 557, available from Polychem Corp., Cranston, Rhode Island, is softer than many other epoxies and therefore may adhere more effectively to polymer substrates, such softer resins are not adequate for many applications. Further, even the softer coating materials benefit from the improved adhesion characteristics utilizing the UV radiation exposure of the polymer substrate. Moreover, certain fillers, such as microballoons may give rise to misleading hardness readings. For example, penetration of a hardness gage needle into the microballoons of the coating material may decrease the hardness reading for a coating material. Therefore, the improved adhesion promoting process is beneficial when using coating materials having a Shore D hardness reading below 60 and even as low as 30.

As previously discussed, several methods of promoting adhesion of coating materials and adhesives are in use. Primarily, they include mechanical abrasion, flame, corona, and chemical primering by either direct mechanical or chemical attack of the polymer substrate, or coating with another adhesion promoting material. Exposing polymer substrates of a polymer based circuit to a UV source is an extremely simple, low cost and highly effective approach to improving adhesion of coating materials to the polymer substrate of a polymer based circuit. The UV adhesion promoting requires much less capital equipment than either applying adhesion promoting resins, such as acrylic coatings, in less than 0.0001 inch thick coatings, flame treating or corona treating methods. The coating thickness of some adhesion promoting resins may even be less than 0.000001 inches and even be only several Angstroms in thickness. Further, the UV radiation adhesion promoting process in accordance with the present invention is more effective than such methods.

The following are examples demonstrating the improved adhesion of polymer films using the UV radiation. Generally, it is shown that exposing the polymer substrates, such as polyester films, to UV radiation prior to the application of a coating or adhesive improves the adhesion of the coating material or the adhesive on the polymer substrate severalfold. Although it is not certain how the adhesion promotion is created, it appears that the polymer is degraded and bonds of the surface are broken, resulting in an adhesion promoted polymer substrate surface such as those shown by reference number 50 in the illustrative embodiments described herein.

EXAMPLE 1

The adhesion promotion method described above was performed by exposing Melinex 453 to UV radiation. Melinex 453 is print treated for adhesion on one side by the manufacturer (ICI Americas, Inc.), has an untreated side, and is about 2 mils (0.002 inches) in thickness. Melinex 453 is available from ICI Americas, Inc., Wilmington, Delaware and is a polyester film. As indicated above, this polyester film includes an untreated side and a print treated side. Both the untreated side and print treated side were exposed to UV radiation in the following manner. The polyester film was partially covered with an opaque material and passed through the UV system for exposure to the UV radiation. Six passes were made through the system with the opaque material being removed partially from an additional portion of the polymer polyester film with each pass. For example, during the first pass through the system for exposure to the UV radiation, only three inches of the polyester film was exposed; during the second pass through the UV system a second three inches were exposed and therefore, the first three inches was exposed a second time. During the third pass, a third three inches of the polyester film was exposed. Therefore, this third three inches was exposed for the first time, the second three inches was exposed for the second time, and the first three inches was exposed for the third time. Such process was continued for six passes through the UV system. The UV system utilized was a SPE UV system available from Screen Printing Enterprises having a place of business at Newport, CA. The UV system was operated at 200 watts per inch at a belt speed of 30 feet per minute. The UV lamp of the SPE UV system operated at 200 watts per linear inch across the conveyor belt was defocused from the belt slightly to provide high intensity light all across the entire conveyor belt and was approximately one inch in depth in the belt travel direction. It is expected that the system could be operated in the range of about 50 watts per linear inch to about 600 watts per linear inch. Although operation in these ranges may change the number of passes of the polymer substrate through the system necessary to achieve similar results.

After exposure of the polyester film, an epoxy encapsulant was applied. The epoxy encapsulant included an epoxy material base resin known as X95F2367, available from Epic Resins Corporation, of Palymyra, WI. This base resin was mixed according to Epic Resins' recommended mix ratio of 100:18 parts by weight with Epic Resins' epoxy hardener No. H5064. The X95F2367 resin used with the H5064 hardener is similar to the EPIC R1055-01/145039 casting system. The H5064 hardener, although similar to the H5039 hardener, has slower curing characteristics. The density of X95F2367 has a density of 1.72 g/cc and has a viscosity at 25° C. of 110,000 cps. After mixing the epoxy, the epoxy mixture was applied to the UV exposed test samples of both the untreated side and the print treated side of the polyester film and also to both an untreated side and a print treated side of a nonexposed control sample of the polyester film. After the mixture was applied and cured according to Epic Resins Corporation's specifications, the polyester film was peeled from the cured epoxy coating. The curing could be performed at room temperature for about 24–48 hours, in about 12 hours at about 40° C., or in about 3 hours at about 60° C. When cured, the encapsulant has a hardness of about 85 Shore D.

The epoxy coating applied to the nonexposed control sample of the polyester film had poor adhesion to the polyester film surface. However, adhesion levels improved significantly and measurably on polyester films with increasing number of passes through the UV unit. The print treated sample of the polyester film that had been passed through the unit four times at the settings and parameters described above, provided strong adhesion levels such that the polyester could not be removed from the epoxy material without tearing or destroying the polyester film. The results with regard to the Melinex polyester film that had not been print treated for adhesion had similar results. Specific results, include:

Print treated side of polyester film with six passes through the system was difficult to peel from the epoxy and some tearing occurred of the polyester film.

The print treated side which had no UV radiation exposure had only fair adhesion, but peeled cleanly from the polyester film.

The non-print treated sample of the polyester film in which no UV radiation exposure occurred had a lower adhesion level than the print treated side, which also had no UV radiation, as would be expected.

The non-print treated side of the polyester film, which was passed through the system six times, as described above, appeared to have comparable adhesion to that of the print treated side with similar number of exposures to the UV radiation.

EXAMPLE 2

In a similar manner as described in Example 1 Melinex ST505 polyester film also available from ICI Americas, Inc was exposed to UV radiation. This film is a polyester film, 5 mils (0.005 inches) thick, with print treatment on both sides. The same epoxy was utilized, and the film also was exposed six times as described in Example 1. A control sample with no UV exposure was also used on the same continuous piece of polyester film. The results from this test indicated that, although each level of exposure improved adhesion of the epoxy, it became most significant at the area exposed three to four times to the UV source. The following data regarding the UV intensity and temperature profile from the SPE UV unit per pass through the system was collected. This profile included:

UV energy 643.60 mJ/cm$^2$

UV peak 280 mW/cm$^2$

UV average 90.01 mW/cm$^2$

Peak temperature 116.8° C.

EXAMPLE 3

In a similar manner as described in Example 2, Melinex ST507 polyester film, also available from ICI Americas, Inc., was exposed to UV radiation. The ST507 polyester film is not print treated. The ST507 polyester film was passed through a Lesco UV curing unit, available from Lesco Incorporated, Lightwave Energy Systems Company, Redondo Beach, Calif., equipped with Fusion Systems Corporation F300-18 "D" type bulbs. The following data regarding the UV intensity and temperature profile was collected with respect to the UV exposure per pass through the system. This profile included:

UV energy 1.48 J/cm$^2$;

UV peak 468.00 mW/cm$^2$;

UV average 158.08 mW/cm$^2$;

Peak temperature 72.0° C.;

Operating at this profile, the polyester film with only one pass through the system had considerably improved adhesion. Although the epoxy material could be removed from the polyester film without tearing the polyester film, adhesion levels over the control sample were significant.

EXAMPLE 4

Melinex ST505, a polyester film also available from ICI Americas, Inc., was exposed to UV radiation only once using the same Lesco UV curing equipped with the "D" type bulbs operating at the same profile as in Example 3. The epoxy coating could not be peeled away from the polyester film without tearing the polyester film, whereas the control sample that received no UV radiation only had fair adhesion but peeled cleanly from the polyester. As is clear from the data, the SPE UV unit is considerably less powerful than the Lesco UV unit with the "D"type bulbs. However, the Lesco unit can be run at a lesser temperature even when delivering more power.

It should be recognized that in Example 3, a nonprint treated polyester film was utilized and in this Example 4, a print treated polyester film was utilized. The same profile for UV exposure of the two different polyester films was utilized resulting in one-pass results of the nonprint treated film having good adhesion but the print treated film having adhesion that prevented the removal of the polyester film from the epoxy material. However, the nonprint treated film could have been run through the unit with higher intensity levels and higher total UV energy or could have been passed through the unit an additional number of times to achieve comparable adhesion levels.

EXAMPLE 5

Kapton™, a polyimide, was passed through the SPE UV unit six times in a manner similar to that described in Example 1 and at a UV intensity and temperature profile substantially similar to the profile described in Example 2. Although polyimides normally have very low adhesion characteristics, a substantial improvement in adhesion was noted with increasing passes through the UV unit. However, the adhesion level did not reach the adhesion level of the nonprint treated ST505 Melinex film UV exposed in Example 2.

EXAMPLE 6

Mylar™ was passed through the SPE UV unit six times in a manner similar to that described in Example 1 and at a UV intensity and temperature profile substantially similar to the profile described in Example 2. The adhesion characteristics after UV treatment were similar to the results of UV exposure of the nonprint treated ST507 film.

Although the above examples are given with some specificity, it should be readily apparent to one skilled in the art that other belt speeds, wavelengths, lamp focus and lamp intensities may also be used with similar, equal, or superior results. Further, one of ordinary skill in the art will recognize that any polymer film used for polymer based or flexible circuits may benefit from the UV exposure in order to promote adhesion of a coating material to the polymer substrate. Moreover, the improved adhesion characteristics were applicable only to the surfaces exposed to the UV radiation and not the reverse side of the films.

One skilled in the art will also recognize that an epoxy encapsulant is not the only coating material to be utilized in the polymeric based circuits and that other coating materials such as, for example, polyurethanes, acrylics, silicones, and polyester resins can be utilized with the present invention.

Although the present invention has been discussed with the preferential hardness of the coating material being in the Shore D hardness range of about 60 or above, and more preferably within the range of about 80 to 90 Shore D, the adhesion promotion process using UV radiation for polymer based circuits is equally applicable to coating materials having softer characteristics such as those having a Shore D value of 30 and above. Further, as previously described, when fillers are utilized with a coating material, the hardness reading may be substantially lower than when fillers are not utilized.

Further, other systems providing UV radiation other than the SPE UV system and the Lesco UV unit are readily available as is known to one skilled in the art. For example, other UV units which may be utilized include a Fusion System Corporation F300-18 Lamp system equipped with "D" type bulbs and the F600-20 Lamp System with "D" type bulbs available from Fusion Systems Corporation, Rockville, Md.

Some operating characteristics of the UV unit include the UV radiation wavelength falling within the range of about 300 to about 450 nanometers, preferably at 365 nanometers, + or −20 nanometers. Further, the UV unit may expose the polymer film in a range of about 50 mJ/cm$^2$ total exposure with a UV peak of greater than about 50 mW/cm$^2$ to a UV total exposure of about 5 J/cm$^2$ with a peak of greater than 50 mW/cm$^2$. However, these operating parameters are time/exposure dependant, i.e. lower levels with a longer time period may also be sufficient. Further, the polymer films may be passed through the unit a number of times to achieve the level of exposure desired. Moreover, various materials, such as polyimides, may be more heat tolerable than others allowing the total exposure to be even higher, for example 10-15 J/cm$^2$.

Although the invention has been described with particular reference to preferred embodiments thereof, variations and modifications of the present invention can be made within a contemplated scope of the following claims as is readily known to one skilled in the art.

What is claimed is:

1. A polymer based circuit production method comprising the steps of:
    treating a surface of a polymer substrate with ultraviolet radiation by directing the ultraviolet radiation in a region proximate the polymer substrate surface in the absence of a flow of ozone being supplied into the region the treatment resulting in an ultraviolet radiation treated polymer substrate surface for promoting adhesion of the surface to a coating material;
    forming at least one circuit on the polymer substrate surface; and
    applying the coating material to at least a portion of the ultraviolet radiation treated polymer substrate surface.

2. The method according to claim 1, wherein the application step includes the step of encapsulating at least a portion of the circuit fabricated on the polymer substrate surface.

3. The method according to claim 1, wherein the polymer substrate is a polyester film.

4. The method according to claim 3, wherein the polyester film includes a print treated polyester film.

5. The method according to claim 1, wherein the treating step comprises the step of exposing the polymer substrate surface to ultraviolet radiation one or more times for a total exposure time of less than a minute.

6. The method according to claim 5, wherein the polymer substrate surface is exposed to UV radiation in a range of about 50 mJ/cm$^2$ UV total exposure with a UV peak greater than about 50 mW/cm$^2$ to a UV total exposure of about 5 J/cm$^2$ with a UV peak of greater than about 50 mW/cm$^2$.

7. The method according to claim 5, wherein the polymer substrate surface is exposed to UV radiation in a range of about 50 mJ/cm$^2$ UV total exposure to a UV total exposure of about 5 J/cm$^2$.

8. The method according to claim 1, wherein the ultraviolet radiation is in the range of about 300 to about 450 nanometer wavelength.

9. The method according to claim 1, wherein the treating step further comprises the steps of:
    positioning the polymer substrate on a belt;
    operating a lamp in a range of about 50 watts per linear inch to about 600 watts per linear inch of the belt; and
    moving the belt such that the polymer substrate surface is exposed to the ultraviolet radiation.

10. The method according to claim 1, wherein the application step includes applying the coating material in a predefined pattern on the polymer substrate surface.

11. The method according to claim 1, wherein the application step includes globbing the coating material over individual components of the at least one circuit.

12. A polymer based circuit production method comprising the steps of:
    treating a surface of a polymer substrate with ultraviolet radiation by directing the ultraviolet radiation in a region proximate the polymer substrate surface in the absence of a flow of ozone being supplied into the region, the treatment resulting in an ultraviolet radiation treated polymer substrate surface for promoting adhesion of the surface to an epoxy;
    forming at least one circuit on the polymer substrate surface;
    applying the epoxy to at least a portion of the ultraviolet radiation treated polymer substrate surface, and
    curing the epoxy to a hardness greater than about 30, Shore D.

13. The method according to claim 12, wherein the epoxy when cured has a hardness greater than about 60, Shore D.

14. The method according to claim 13, wherein the epoxy when cured has a hardness more preferably in the range of about 80 to about 90, Shore D.

15. A method according to claim 12, wherein the exposure of the polymer substrate surface results in an adhesion level between the polymer substrate surface and the epoxy, the adhesion level increasing with the number of times the polymer substrate surface is exposed to the ultraviolet radiation.

16. A polymer based circuit production method comprising the steps of:

treating a surface of a polymer substrate with ultraviolet radiation by directing the ultraviolet radiation in a region proximate the polymer substrate surface in the absence of a flow of ozone being supplied into the region the treatment resulting in an ultraviolet radiation treated polymer substrate surface for promoting adhesion of the surface to a coating material;

forming at least one circuit on the polymer substrate surface, wherein the circuit formation step includes:
 forming a conductive trace on the polymer substrate surface; and
 mounting circuit components on the polymer substrate surface in electrical communication with the conductive trace to form the at least one circuit; and applying the coating material to at least a portion of the ultraviolet radiation treated polymer substrate surface, wherein the coating material application step includes:
 forming a barrier on the polymer substrate surface to define at least one cavity surrounding at least a portion of the at least one circuit; and
 depositing the coating material in the at least one cavity such that the components in the at least one cavity are encapsulated between the polymer substrate and the coating material.

17. The method according to claim 16, wherein the coating material is an epoxy in a viscous state when placed in the cavity and the application step further includes the step of curing the epoxy.

18. The method according to claim 16, wherein the at least one circuit includes a plurality of separate circuits, the barrier being positioned on the polymer substrate to form a cavity surrounding one or more of the plurality of separate circuits.

19. The method according to claim 16, wherein the barrier is positioned on the polymer substrate to form a cavity individually surrounding one or more of the electrical components.

20. A polymer based circuit production method comprising the steps of:

treating a surface of a polymer substrate with ultraviolet radiation by directing ultraviolet radiation in a region proximate the polymer substrate surface in the absence of a flow of ozone gas being supplied into the region, the treatment resulting in an ultraviolet radiation treated polymer substrate surface for promoting adhesion of the surface to a coating material;

forming at least one circuit on the polymer substrate surface;

applying the coating material to at least a portion of the ultraviolet radiation treated polymer substrate surface to encapsulate at least a portion of the circuit: and curing the coating material to a hardness greater than about 30, Shore D.

21. The method according to claim 20, wherein the treating step comprises exposing the polymer substrate surface to ultraviolet radiation one or more times for less than a minute of total exposure time, ultraviolet radiation.

22. The method according to claim 21, wherein the polymer substrate surface is exposed to UV radiation in a range of about 50 mJ/cm$^2$ UV total exposure with a UV peak greater than about 50 mW/cm$^2$ to a UV total exposure of about 5 J/cm$^2$ with a UV peak of greater than about 50 mW/cm$^2$.

23. The method according to claim 21, wherein the ultraviolet radiation is in the range of about 340 to about 450 nanometer wavelength.

24. The method according to claim 23, wherein the ultraviolet radiation is in the range of about 340 nanometers to about 380 nanometers wavelength.

25. The method according to claim 21, wherein the exposing step further comprises the steps of:

positioning the polymer substrate on a belt of a UV radiation system;

defocusing a lamp operating in a range of about 50 watts per linear inch to about 600 watts per linear inch of the belt at about one inch in the direction of belt travel; and moving the belt such that the polymer substrate surface is exposed to the ultraviolet radiation.

26. A polymer based circuit production method comprising the steps of:

exposing a surface of a polymer substrate to ultraviolet radiation in ambient air atmosphere one or more times for less than a minute of total exposure time resulting in an ultraviolet radiation treated polymer substrate surface for promoting adhesion of the surface to a coating material wherein exposing the surface includes continuously moving the surface through a UV radiation system such that the polymer substrate surface is exposed to the ultraviolet radiation;

forming at least one circuit on the polymer substrate surface; and applying the coating material to at least a portion of the ultraviolet radiation treated polymer substrate surface to encapsulate at least a portion of the circuit.

27. The method according to claim 26, wherein the epoxy when cured has a hardness greater than about 30, Shore D.

28. The method according to claim 26, wherein the polymer substrate surface is exposed to UV radiation in a range of about 50 mJ/cm$^2$ UV total exposure with a UV peak greater than about 50 mW/cm$^2$ to a UV total exposure of about 5 J/cm$^2$ with a UV peak of greater than about 50 mW/cm$^2$.

29. The method according to claim 26, wherein the ultraviolet radiation is in the range of about 340 to about 450 nanometer wavelength.

30. The method according to claim 29, wherein the ultraviolet radiation is in the range of about 340 nanometers to about 380 nanometers wavelenth.

31. The method according to claim 26, wherein the exposing step further comprises the steps of:

positioning the polymer substrate on a belt of a UV radiation system;

operating a lamp in a range of about 50 watts per linear inch to about 600 watts per linear inch of the belt; and moving the belt such that the polymer substrate surface is exposed to the ultraviolet radiation.

32. A polymer based circuit production method comprising the steps of:

exposing a surface of a polymer substrate to ultraviolet radiation having a wavelength in the range of about 340 to about 450 nanometers, the exposure resulting in an ultraviolet radiation treated polymer substrate surface for promoting adhesion of the surface to a coating material;

forming at least one circuit on the polymer substrate surface; and applying the coating material to at least a portion of the ultraviolet radiation treated polymer substrate surface.

33. The method according to claim 32, wherein the wavelength is in the range of about 340 nanometers to about 380 nanometers.

34. The method according to claim 32, wherein the exposing step comprises exposing the polymer substrate surface to ultraviolet radiation one or more times for less than a minute of total exposure time.

35. The method according to claim 34, wherein the polymer substrate surface is exposed to UV radiation in a range of about 50 mJ/cm$^2$ UV total exposure to a UV total exposure of about 5 J/cm$^2$.

36. The method according to claim 34, wherein the exposing step further comprises the steps of:

positioning the polymer substrate on a belt of a UV radiation system;

operating a lamp in a range of about 50 watts per linear inch to about 600 watts per linear inch of the belt; and moving the belt such that the polymer substrate surface is exposed to the ultraviolet radiation.

37. The method according to claim 32, wherein the application step includes encapsulating at least a portion of the circuit by applying an epoxy to at least a portion of the ultraviolet radiation treated polymer substrate surface.

38. The method according to claim 37, wherein the epoxy when cured has a hardness greater than about 30, Shore D.

39. A polymer based circuit production method comprising the steps of:

directing ultraviolet radiation at a surface of a polymer substrate resulting in an ultraviolet radiation treated polymer substrate surface for promoting adhesion of the surface to a coating material, wherein the polymer substrate surface is exposed to a total UV radiation exposure greater than about 50 mJ/cm$^2$;

forming at least one circuit on the polymer substrate surface; and applying the coating material to at least a portion of the ultraviolet radiation treated polymer substrate surface.

40. The method according to claim 39, wherein the total UV radiation exposure is in the range of about 50 mJ/cm$^2$ UV with a UV peak greater than about 50 mW/cm$^2$ to a UV total exposure of about 5 J/cm$^2$ with a UV peak of greater than about 50 mW/Cm$^2$.

41. The method according to claim 39, wherein the total UV radiation exposure is in a range of about 50 mJ/cm$^2$ UV total exposure to a UV total exposure of about 5 J/cm$^2$.

42. The method according to claim 39, wherein the wavelength of the ultraviolet radiation is in the range of about 340 to about 450 nanometers.

* * * * *

UNITED STATES PATENT AND TRADEMARK OFFICE
CERTIFICATE OF CORRECTION

PATENT NO.      : 5,987,739
DATED           : November 23, 1999
INVENTOR(S)     : Lake It is certified that error appears in the above-identified patent and that said Letters Patent is hereby corrected as shown below:

On the Cover page of patent,
Second column of "References Cited," please delete duplicate citation of "59-197433 11/1984 Japan".

On the Cover page of patent,
Second column of "References Cited," please delete "9/1984" at Japanese Patent No. 5 919 7433, and insert therefor --11/1984--.

Column 14,
Line 3, please insert --,-- after "region";
Line 60, please delete "," and insert therefor --;-- after "surface";
Line 66, please delete "more preferably".

Column 15,
Line 12, please insert --,-- after "region";
Line 59, please delete ":" and insert therefor --;-- after "circuit;
Line 65, please delete ", ultraviolet radiation".

UNITED STATES PATENT AND TRADEMARK OFFICE
CERTIFICATE OF CORRECTION

PATENT NO.   : 5,987,739
DATED        : November 23, 1999
INVENTOR(S)  : Lake

It is certified that error appears in the above-identified patent and that said Letters Patent is hereby corrected as shown below:

<u>Column 16,</u>
Line 28, please insert --,-- after "material"; and
Line 37, please delete "the epoxy" and insert therefor --the coating material-- after "wherein".

Signed and Sealed this

Nineteenth Day of June, 2001

*Attest:*

NICHOLAS P. GODICI
*Attesting Officer* — *Acting Director of the United States Patent and Trademark Office*